United States Patent [19]
Bill et al.

[11] Patent Number: 6,147,906
[45] Date of Patent: Nov. 14, 2000

[54] METHOD AND SYSTEM FOR SAVING OVERHEAD PROGRAM TIME IN A MEMORY DEVICE

[75] Inventors: Colin S. Bill; Shigekazu Yamada, both of Cupertino, Calif.

[73] Assignees: Advanced Micro Devices, Inc., Sunnyvale, Calif.; Fujitsu Ltd., Japan

[21] Appl. No.: 09/419,695

[22] Filed: Oct. 14, 1999

[51] Int. Cl.[7] ................................................. G11C 16/04
[52] U.S. Cl. ........................... 365/185.14; 365/185.24; 365/185.33
[58] Field of Search ................... 365/185.14, 185.18, 365/185.23, 185.24, 185.33

[56] References Cited

U.S. PATENT DOCUMENTS

| 5,467,309 | 11/1995 | Tanaka et al. | 365/185.14 |
| 5,701,266 | 12/1997 | Fazio et al. | 365/185.03 |
| 5,729,489 | 3/1998 | Fazio et al. | 365/185.03 |

*Primary Examiner*—Richard Elms
*Assistant Examiner*—Hien Nguyen
*Attorney, Agent, or Firm*—Brinks Hofer Gilson & Lione

[57] ABSTRACT

The present invention discloses a method for saving overhead programming time in a flash memory. In the preferred embodiment of the invention, a wordline voltage generation circuit and a bitline voltage generation circuit are electrically connected with a comparator circuit. During the programming operation, the comparator circuit compares a wordline programming voltage and a bitline enabling voltage generated by the voltage generation circuits to determine when the programming voltages reach a predetermined voltage level. Once the predetermined voltage level is reached, the comparator circuit sends an output signal to a state machine that initiates programming for at least one cell. The present invention provides advantages over prior methods of programming by reducing the time period that the state machine waits to initiate programming.

25 Claims, 4 Drawing Sheets

METHOD AND SYSTEM FOR SAVING OVERHEAD PROGRAM TIME IN A MEMORY DEVICE

FIELD OF THE INVENTION

The present invention relates generally to programming cells in memory devices and, more particularly, to a method and system for saving overhead program time in a flash electrically erasable programmable memory (EEPROM).

BACKGROUND OF THE INVENTION

Flash memories are popular memory storage devices because they store information in the absence of continuous power and are capable of being constructed in a very compact form. Flash memory is typically constructed by fabricating a plurality of floating gate transistors in a silicon substrate. A floating gate transistor is capable of storing electrical charge either on a separate gate electrode, known as a floating gate, or in a dielectric layer underlying a control gate electrode. Generally speaking, data is stored in a non-volatile memory device by the storage of an electrical charge in the floating gate.

A cell is typically programmed by applying a predetermined voltage to the control gate, a second predetermined voltage to the drain, and grounding the source. This causes channel hot electrons to be injected from the drain depletion region into the floating gate. The predetermined voltages that are used during the programming operation are typically higher than the supply voltage (Vcc). When reading a cell, if the cell is programmed, the threshold voltage will be relatively high and the bitline current will be zero or relatively low. If the cell is not programmed or erased, the threshold voltage will be relatively low, the control gate voltage will enhance the channel and the bitline current will be relatively high.

In most types of flash memory devices, at least one charge pump is used to increase a small input voltage into the larger voltages that are used to program the flash memory. As known in the art, these voltages affect the reading and writing of data to and from the flash memory. The voltage is increased by channeling the relatively small input voltage through a series of stages that enhance the signal to an increased voltage value. The more stages a charge pump has, the greater the resulting output voltage. Those skilled in the art would recognize that several charge pump circuit architectures exist and that each design has special characteristics depending on the arrangement and characteristics of the components.

Charge pump-up time directly affects the time needed to write information to a particular cell in a sector of memory. Charge pump-up time refers to the amount of time necessary to convert the small input voltage into the required output voltage necessary to program a given cell or set of cells. Currently, most charge pumps are constructed using several bootstrap capacitors having the same size capacitance at each respective node of the charge pump. A bootstrap capacitor is defined as the capacitor connected to each respective node of the charge pump. Those skilled in the art recognize that to reduce rise time, the capacitance at each successive node can be increased until the application defined speed requirement is met. However, the rise time does not improve significantly with the increase of capacitance and the decrease in rise time eventually reaches a limit that cannot be surpassed.

The charge pump-up time causes problems in conventional memory devices because more than one charge pump is used to generate voltages during the programming operation. During the programming operation, once a state machine receives an instruction set that indicates a programming operation is required in a particular sector, the state machine sends an electrical signal to the charge pumps, thereby causing the selected charge pumps to start charging to a predetermined programming voltage. The cell or cells to be programmed cannot be programmed until the charge pumps reach the predetermined voltage levels required for programming.

In prior flash memory, the state machine does not initiate programming until a predetermined amount of time has passed, thereby allowing the charge pumps to charge up to the predetermined programming voltage level. The predetermined amount of time that the state machine waits until programming at least one cell is based on a worst-case scenario in charge pump-up time. As such, in prior art memory devices, the state machine wastes valuable time waiting for the charge pumps to reach the predetermined programming voltage levels before programming is initiated for at least one cell in the memory sector.

To that end, a need exists for a method and system that saves overhead programming time in a memory device by reducing the waiting period required for the programming voltages to charge to the predetermined voltage level before programming is initiated for at least one cell in the memory device.

SUMMARY OF THE PRESENT INVENTION

The present invention discloses a method and system for saving overhead programming time in a memory device, which is a flash memory in the preferred embodiment of the present invention. In the preferred flash memory, two programming voltages are used during a programming operation. As such, a wordline programming voltage (VPXG) and a bitline enabling voltage (VPPI) are generated by voltage generation circuits and directed to a comparator circuit. The comparator circuit compares the wordline programming voltage (VPXG) and the bitline enabling voltage (VPPI) and provides a comparator output signal (VPPOK) to a state machine once the voltages (VPXG and VPPI) reach a predetermined programming voltage level, which is 8.5 V in the preferred embodiment. After the state machine receives the comparator output signal (VPPOK), the state machine sends electrical signals to a predetermined wordline decoder circuit and a predetermined bitline decoder circuit that actually program at least one cell in the flash memory.

In the preferred embodiment of the present invention, the state machine is electrically connected with a wordline voltage generation circuit, a bitline voltage generation circuit and the comparator circuit. During the programming operation, when a programming instruction set is received by the state machine, electric signals are sent by the state machine to the wordline voltage generation circuit and the bitline voltage generation circuit. In response to the electric signals from the state machine, the wordline voltage generation circuit starts generating a wordline programming voltage (VPXG) and the bitline voltage generation circuit starts generating a bitline programming voltage of 5.0 V which is gated to a respective bitline with the bitline enabling voltage (VPPI).

The output of the wordline voltage generation circuit is connected with the wordline decoder circuit and the comparator circuit. In addition, the output of the bitline voltage generation circuit is connected with the bitline decoder circuit and the comparator circuit. Thus, the wordline programming voltage (VPXG) and the bitline enabling voltage (VPPI) are passed to the comparator circuit and a respective decoder circuit in the flash memory. During the programming operation, once the comparator circuit determines that the voltages (VPXG and VPPI) have reached the predetermined programming voltage level, the comparator circuit generates the comparator output signal (VPPOK) that is sent from the comparator circuit to the state machine. The comparator output signal (VPPOK) indicates to the state machine that the wordline programming voltage (VPXG) and the bitline enabling voltage (VPPI) have reached the predetermined programming voltage level so that programming can begin on the chosen cell in the sector of flash memory. The wordline voltage generation circuit and the bitline voltage generation circuit are charge pumps that increase a small supply voltage (Vcc), which is 3.3 V in the preferred embodiment, into the larger voltages that are used during the programming operation. Although only the wordline programming voltage (VPXG) is actually applied to the cell during the programming operation, both programming voltages (VPXG and VPPI) are used during the programming operation. As previously set forth, during the typical programming operation, approximately 8.5 V is applied to the control gate of the cell, approximately 5.0 V is applied to the drain of the cell, and the source of the cell is approximately held at ground. The 5.0 V that is applied to the drain of the cell is generated from a separate charge pump and gated to the cell by the bitline enabling voltage (VPPI).

As known in the art, a fundamental component of any memory device is the decoder circuits. In general, decoder circuits output a unique signal if, and only if, all of the bits of an address input correspond to a predetermined set of values. As previously set forth, the output of the wordline voltage generation circuit is electrically connected with the wordline decoder circuit. In addition, the output of the bitline voltage generation circuit is electrically connected with the bitline decoder circuit. During the programming operation, the wordline decoder circuit transfers the wordline programming voltage (VPXG) to the gate of the cell to be programmed. The bitline enabling voltage (VPPI) is used by the bitline decoder circuit to pass a programming voltage of approximately 5.0 V to the drain of the cell to be programmed. As known in the art, the source of the cell to be programmed is held at approximately ground level during the programming operation. The source may also be connected via a resistive load to ground.

In the preferred embodiment of the invention, four cells are programmed at a time during the programming operation. The present invention saves overhead programming time by reducing the time period the state machine has to wait while the wordline voltage generation circuit and the bitline voltage generation circuit charge up to the predetermined programming voltages (VPXG and VPPI). In prior flash memory, the state machine would use a time delay of approximately two microseconds before actually programming the chosen cell. The actual programming time is approximately one microsecond. As such, prior flash memory required approximately three microseconds to program four cells. The present invention allows programming to begin on the chosen cell in one microsecond typically, which means that it takes approximately two microseconds to program four cells. Thus, the present invention reduces the overhead programming time in flash memory, which leads to flash memory that is capable of operating at higher speeds during programming.

These and other features and advantages of the invention will become apparent upon consideration of the following detailed description of the presently preferred embodiments of the invention, viewed in conjunction with the appended drawings.

DETAILED DESCRIPTION OF THE PRESENTLY PREFERRED EMBODIMENT OF THE INVENTION

The exemplary embodiments of the invention are set forth below with reference to specific configurations, and those skilled in the art would recognize that various changes and modifications can be made on the specific configurations while remaining within the scope of the claims. The invention may be used with any type of memory device; however, the preferred embodiment of the invention is designed for a flash memory. Although the preferred embodiment of the invention uses a supply voltage (Vcc) of 3.3 V, those skilled in the art would recognize that other supply voltage levels may be used. The invention may also be used with flash memory devices that use Fowler-Nordheim (F-N) or channel hot electron (CHE) injection for erase and programming.

Figure 1:
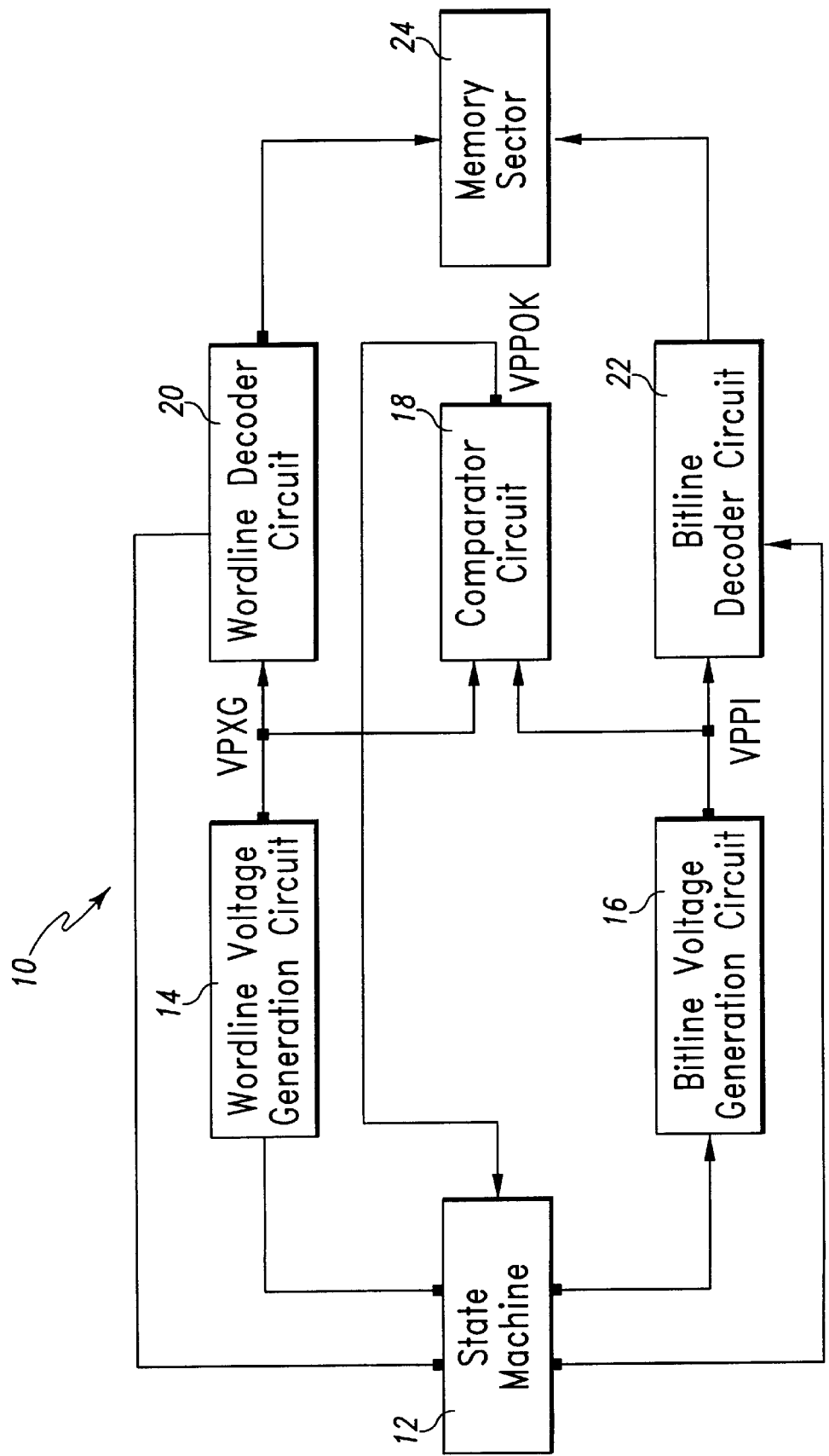
FIG. 1 illustrates a block diagram of a portion of the preferred flash memory.

Referring to FIG. 1, the present invention discloses a method for saving overhead programming time in a memory device, which is a flash memory 10 in the preferred embodiment. The preferred flash memory 10 comprises a state machine 12, a wordline voltage generation circuit 14, a bitline voltage generation circuit 16, a comparator circuit 18, at least one wordline decoder circuit 20, at least one bitline decoder circuit 22 and at least one memory sector 24. In the preferred embodiment, the memory sector 24 is a flash transistor array with rows and columns of cells, as well known in the art. The present invention saves overhead programming time by using the comparator circuit 18 to determine when the wordline voltage generation circuit 14 and the bitline voltage generation circuit 16 have reached a predetermined programming voltage level, which is 8.5 V in the preferred embodiment.

As known in the art, the state machine 12 is used to control the overall operation of the flash memory 10 in response to instruction sets that are received by the state machine 12. State machines 12 are commonly used in memory devices for storing information representing the state of the flash memory 10 and for outputting a new state based upon the current state and any input signals received by the state machine 12. For example, within flash memory 10, state machines 12 are used to facilitate communication with peripheral devices (not shown) that are using the flash memory 10, particularly by coordinating "hand-shaking" protocols and the like. These peripheral devices use the flash memory 10 to store information specific to the operation of the peripheral device.

Referring once again to FIG. 1, the state machine 12 is electrically connected with the wordline voltage generation circuit 14, the bitline voltage generation circuit 16 and the output of the comparator circuit 18. During operation, when a programming signal is received by the state machine 12, an electric signal is sent by the state machine 12 to the wordline voltage generation circuit 14 and the bitline voltage generation circuit 16. The signal from the state machine 12 causes the wordline voltage generation circuit 14 to start generating a wordline programming voltage (VPXG) and the bitline voltage generation circuit 16 to start generating a bitline enabling voltage (VPPI). These voltages (VPXG and VPPI) are used by the flash memory 10 during the programming operation, as set forth in detail below.

The output of the wordline voltage generation circuit 14 is connected with the wordline decoder circuit 20 and the comparator circuit 18. In addition, the output of the bitline voltage generation circuit 16 is connected with the bitline decoder circuit 22 and the comparator circuit 18. Once the comparator circuit 18 determines that the wordline programming voltage (VPXG) and the bitline enabling voltage (VPPI) have reached the predetermined voltage level, a comparator output signal (VPPOK) is sent from the comparator circuit 18 to the state machine 12. The output signal (VPPOK) indicates to the state machine 12 that the wordline programming voltage (VPXG) and the bitline enabling voltage (VPPI) have reached the predetermined voltage level required to program a predetermined cell in the memory sector 24.

In the preferred embodiment of the present invention, the wordline voltage generation circuit 14 and the bitline voltage generation circuit 16 are charge pumps that increase a small supply voltage (Vcc), which is 3.3 V in the preferred embodiment, into the larger voltages (VPXG and VPPI) that are used during programming. As previously set forth, charge pumps are known in the art and several different charge pump circuit architectures are capable of generating the programming voltages required by the flash memory 10. Those skilled in the art would recognize that several different charge pumps may be used in the present invention and a detailed discussion of charge pumps is not necessary for an understanding of the present invention.

As previously set forth, the wordline voltage generation circuit 14 and the bitline voltage generation circuit 16 are electrically connected with the comparator circuit 18. The voltage generation circuits 14, 16 direct the wordline programming voltage (VPXG) and the bitline enabling voltage (VPPI) to the comparator circuit 18. Comparator circuits are well known in the semiconductor industry. Such circuits are used in a variety of applications for comparing a first input signal with a second input signal and generating an output signal representative of a determination made by that comparison. In the present invention, the comparator output signal (VPPOK) is sent from the comparator circuit 18 to the state machine 12 once the wordline programming voltage (VPXG) and the bitline enabling voltage (VPPI) 16 reach the predetermined programming voltage level, which is 8.5 V in the preferred embodiment. Those skilled in the art would recognize that several different types of comparator circuits may be used in the present invention.

Figure 2:
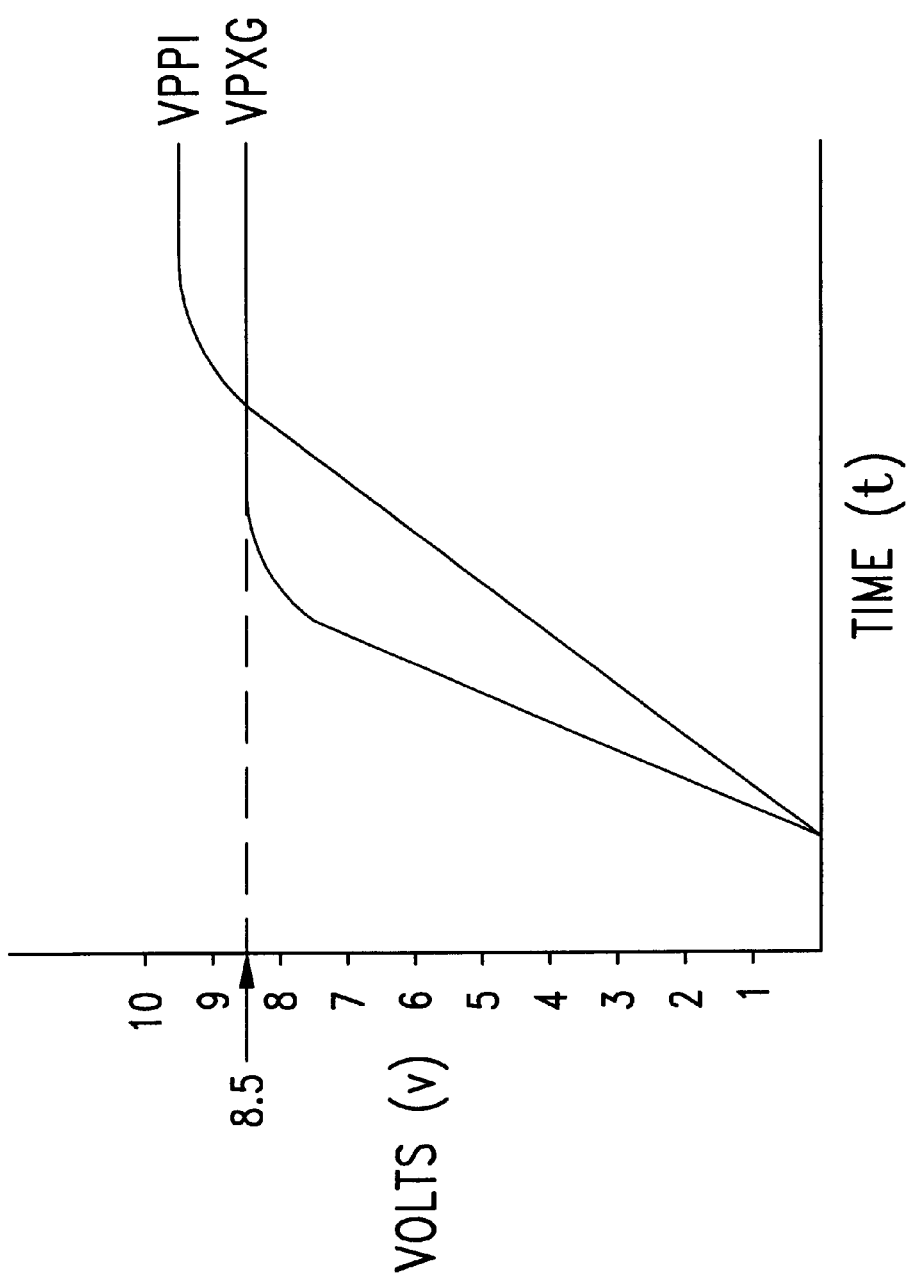
FIG. 2 illustrates the rise times of the wordline programming voltage (VPXG) and the bitline enabling voltage (VPPI).

Referring to FIG. 2, the comparator circuit 18 uses the wordline programming voltage (VPXG) that is generated by the wordline voltage generation circuit 14 as a reference voltage in the preferred embodiment. The rise time of the wordline programming voltage (VPXG) is faster than the rise time of the bitline enabling voltage (VPPI). Once the wordline programming voltage (VPXG) and the bitline enabling voltage (VPPI) reach 8.5 V, the comparator circuit 18 generates the comparator output signal (VPPOK), which is directed to the state machine 12. The comparator output signal (VPPOK) indicates that the wordline programming voltage (VPXG) and the bitline enabling voltage (VPPI) have charged up to a sufficient voltage level for the programming operation. The state machine 12 initiates programming once the wordline programming voltage (VPXG) and the bitline enabling voltage (VPPI) reach the predetermined programming voltage level.

Referring once again to FIG. 1, in the preferred embodiment of the invention, decoder circuits 20, 22 are used to direct predetermined voltages to at least one cell to be programmed in the memory sector 24. As known in the art, decoder circuits enable a particular cell in a matrix of memory cells if an input memory address matches the predetermined address of a memory cell connected with the decoder circuit. Once selected, the decoder circuits 20, 22 allow the state machine to transfer predetermined voltages to the selected cells in the memory sector 24 during an operation such as program, read, erase or verify. Those skilled in the art would recognize that various decoder circuit architectures exist and may be used in the present invention.

Figure 3:
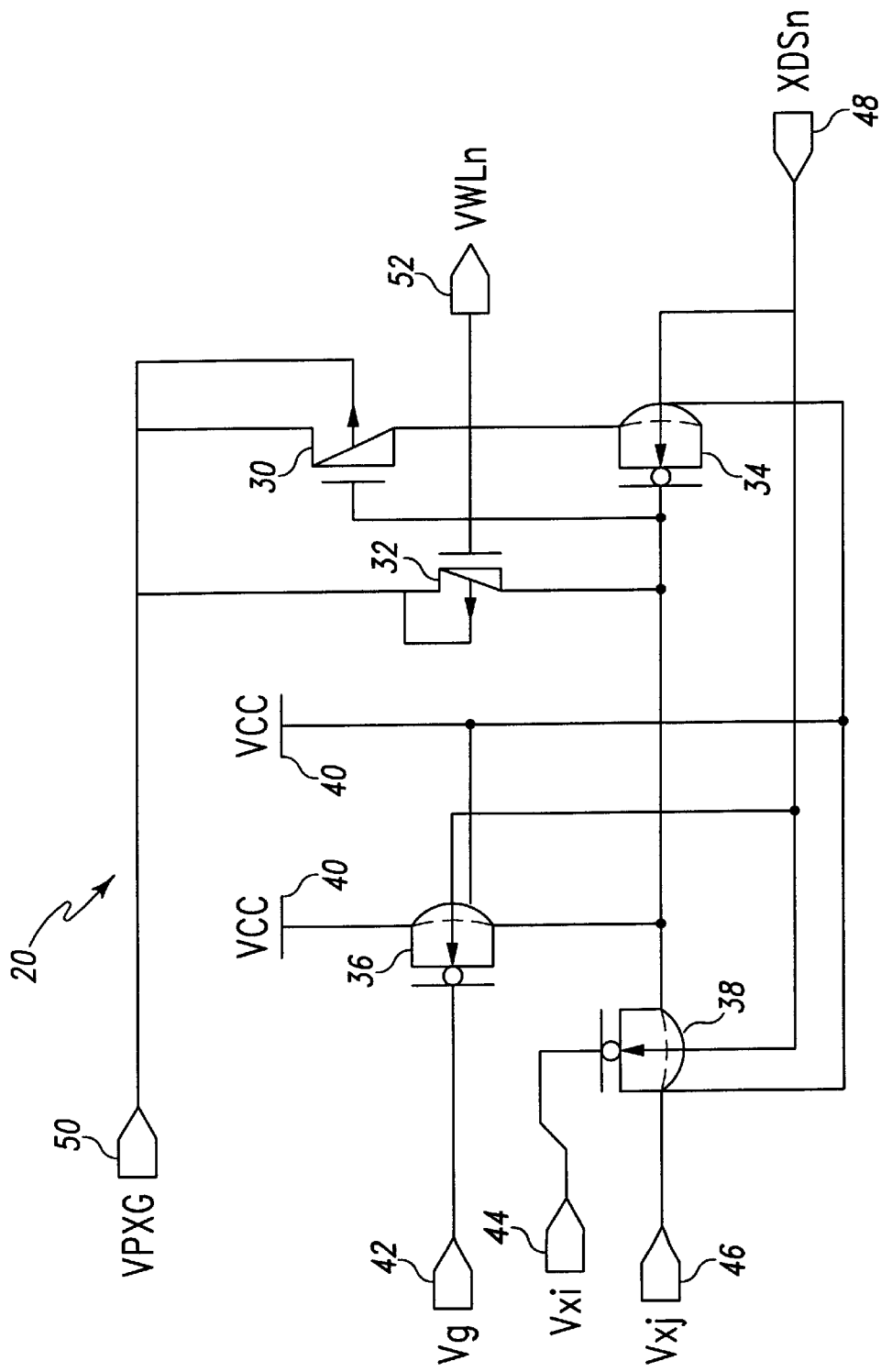
FIG. 3 is a circuit schematic of the presently preferred wordline decoder circuit.

Referring to FIG. 3, a circuit schematic of the preferred wordline decoder circuit 20 used in the present invention is illustrated. In general, the wordline decoder circuit 20 comprises a plurality of p-channel enhancement transistors 30, 32, a plurality of low threshold n-channel enhancement transistors 34, 36, 38 that are electrically connected as illustrated. The wordline decoder circuit 20 is also electrically connected with a supply voltage line (Vcc) 40. The wordline decoder circuit 20 is controlled by the state machine 12 with a Vg control line 42, a plurality of pre-decoded address lines (Vxi—Vxi) 44, 46, and an Xds control line 48 that are electrically connected with the wordline decoder circuit 20.

As known in the art, during the programming operation the state machine 12 directs electric signals to the wordline decoder circuit 20 with the Vg control line 42, the address lines (Vxi—Vxj) 44, 46, and the Xds control line 48. Generally speaking, the Vg line 42 and the Xds line 46 are connected with voltage nodes that are controlled by the state machine 12 during the programming operation. The address lines (Vxi—Vxi) 44, 46 are used as address inputs by the state machine 12 to select a predetermined wordline decoder circuit 20 during the programming operation, as known in the art.

As further illustrated in FIG. 3, the predetermined programming voltage (VPXG) is connected with the wordline decoder circuit 20 through a VPXG line 50 that is electrically connected with the source and well of p-channel transistor 30 and the source and well of p-channel transistor 32. As previously set forth, the wordline decoder circuit 20 is used to transfer the wordline programming voltage (VPXG), which is generated by the wordline voltage generation circuit 14, to the selected wordline in the memory sector 24 during the programming operation. A Vwl line 52 is used to electrically connect the output of the wordline decoder circuit 20 with a particular sub x-decoder (not illustrated) in the memory sector 24. The sub x-decoder is then used to direct the 5.0 V programming voltage to the drain of the selected cell in the memory sector 24. Those skilled in the art would recognize that a typical memory sector includes a plurality of wordlines.

During the programming operation, the wordline programming voltage (VPXG) reaches approximately 8.5 V before being transferred to the gates of cells in a selected wordline of the memory sector 24. The wordline programming voltage (VPXG) reaches this magnitude because the wordline voltage generation circuit 14 continues to charge up while the state machine 12 is selecting the appropriate wordline decoder circuit 20 and bitline decoder circuit 22 to program the predetermined cell. Those skilled in the art would recognize that other decoder circuits may be used in the present invention and that the embodiment set forth above should not be construed as a limitation of the present invention. In addition, those skilled in the art would recognize that a plurality of decoder circuits are used in the preferred flash memory 10.

Figure 4:
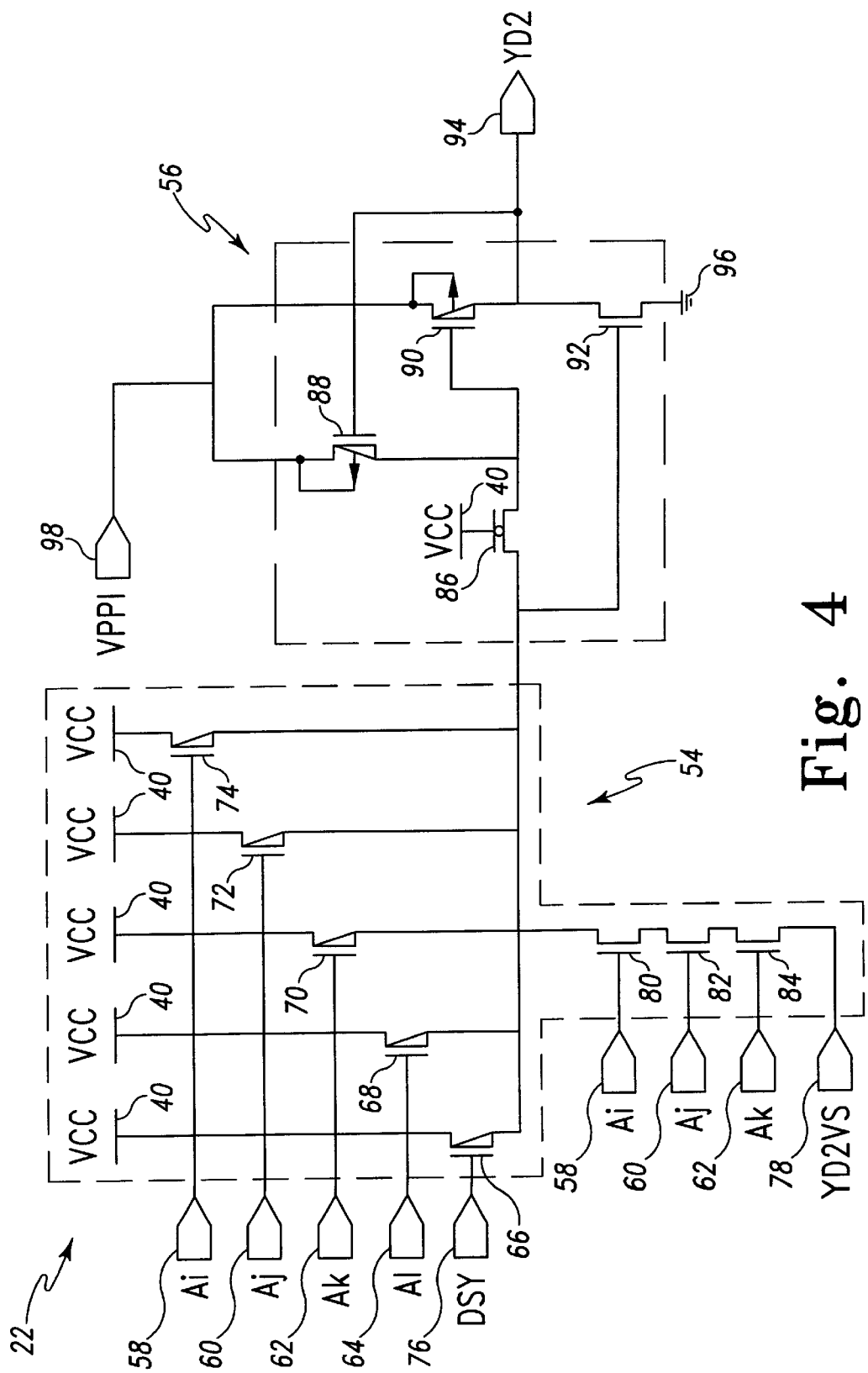
FIG. 4 is a circuit schematic of the presently preferred bitline decoder circuit.

FIG. 4 illustrates a circuit schematic of the preferred bitline decoder circuit 22 used in the present invention. In general, the bitline decoder circuit 22 comprises an address decoder circuit 54 and a high-voltage level shift output stage 56. The output of the address decoder circuit 54 is electrically connected with the high-voltage level shift output stage 56. As known in the art, during operation, the address circuit 54 is controlled by electric signals from the state machine 12 to determine which particular bitline decoder circuit 22 is used during the programming operation. When the state machine 12 selects a particular bitline decoder circuit 22, the high-voltage level shift output stage 56 directs approximately 5.0 V to the drain of the chosen cell in a selected column of the memory sector 24.

In general, the address decoder circuit 54 includes a plurality of address input lines (Ai–Aj) 58, 60, 62, 64, a plurality of p-channel transistors 66, 68, 70, 72, 74, a DSY line 76, a YD2VS line 78 and a plurality of n-channel enhancement transistors 80, 82, 84 electrically connected as illustrated in FIG. 4. The address circuit 54 is also electrically connected with the supply voltage line (Vcc) 40. As known in the art, the address circuit 54 of the bitline decoder circuit 22 is used by the state machine 12 to a select a particular bitline decoder circuit 22 during the programming operation. Once the appropriate bitline decoder circuit 22 is selected by the state machine 12, the bitline decoder circuit 22 is used to direct a predetermined drain programming voltage to the drain of a column of cells in the memory sector 24.

The high-voltage level shift output stage 56 includes a low-threshold n-channel transistor 86, a plurality of p-channel transistors 88, 90, an n-channel enhancement transistor 92, a YD2 output line 94 and a ground connection 96. As illustrated in FIG. 4, the bitline programming voltage (VPPI) is electrically connected with the high-voltage level shift output stage 56 by a VPPI line 98 that originates from the bitline voltage generation circuit 16. The high-voltage level shift output stage 56 is also electrically connected with the supply voltage line (Vcc) 40. Although not illustrated, the YD2 line 94 is electrically connected with at least one column select transistor for a column of cells in the memory sector 24. As previously set forth, the bitline decoder 22 is used to direct a programming voltage of 5.0 V to the drains of cells during the programming operation.

As previously set forth, the bitline enabling voltage (VPPI), which is approximately 9.1 V in the preferred embodiment, is directed to the bitline decoder circuit 20 during the programming operation. The bitline enabling voltage (VPPI) is electrically connected with the source and well of p-channel transistor 88 and the source and well of p-channel transistor 90 by the VPPI line 98. When the bitline enabling voltage (VPPI) is applied to the VPPI line 98 it causes the high-voltage level shift output stage 56 to direct approximately 5.0 V to the drain of the selected cell in the memory sector 24. The bitline enabling voltage (VPPI) is chosen as 9.1 V or higher in the preferred embodiment of the invention because the high-voltage level shift output stage 56 and the column select transistor operate at maximum efficiency using these voltage levels.

Referring once again to FIG. 1, the present invention discloses a method of saving overhead programming time in a flash memory 10. In operation, the state machine 12 receives a set of input signals from a peripheral device that needs to program information into the flash memory 10 for storage. In response to the input signals, the state machine 12 sends an electric signal to the wordline voltage generation circuit 14 and an electrical signal to the bitline voltage generation circuit 16. The signals from the state machine 12 cause the wordline voltage generation circuit 14 and the bitline voltage generation circuit 16 to start charging to their respective programming voltages (VPXG and VPPI).

The wordline programming voltage (VPXG) that is generated by the wordline voltage generation circuit 14 is electrically connected with the comparator circuit 18 and the wordline decoder circuit 20. The bitline enabling voltage (VPPI) that is generated by the bitline voltage generation circuit 16 is electrically connected with the comparator circuit 18 and the bitline decoder circuit 22. The comparator circuit 18 monitors the wordline programming voltage (VPXG) and the bitline enabling voltage (VPPI) until they reach a predetermined voltage level, then sends the comparator output signal (VPPOK) to the state machine 12 once the voltages (VPXG and VPPI) have charged to the predetermined voltage level.

After the state machine 12 receives the comparator output signal (VPPOK), the state machine 12 selects the appropriate wordline decoder circuit 20 and the appropriate bitline decoder circuit 22, thereby programming the selected cell in the memory sector 24. Those skilled in the art would recognize that in most flash memory 10, several wordline decoder circuits 20 and bitline decoder circuits 22 are electrically connected with the state machine 12. Once the above-referenced step is complete, the selected cells to be programmed in the memory sector 24 are programmed by application of the aforementioned programming voltages to the selected cell. To that end, the wordline decoder circuit 20 applies approximately 8.5 V to the gate of the selected cell, the bitline decoder circuit 22 applies approximately 5.0 V to the drain of the selected cell, which is gated to the cell by the column select transistor with the bitline enabling voltage (VPPI) on the gate. In addition, the source of the selected cell is grounded or connected via a resistive load to ground.

In the preferred embodiment of the present invention, four cells are programmed at a time in the memory sector 24. The present invention saves overhead programming time by reducing the time the state machine 12 waits while the wordline voltage generation circuit 14 and the bitline voltage generation circuit 16 charge up to the predetermined wordline programming voltage (VPXG) the bitline enabling voltage (VPPI). In prior flash memory, the state machine 12 would wait for approximately two microseconds before beginning the programming operation. This time frame was chosen so that the wordline programming voltage (VPXG) and the bitline enabling voltage (VPPI) would have more than ample time to charge to the predetermined programming voltage level. As such, prior flash memory required three microseconds to program four cells. Using the method and system set forth above, allows programming to begin in approximately one microsecond, which means that it takes approximately two microseconds to program four cells. Thus, the present invention reduces overhead program time, which leads to flash memory that is capable of operating at higher speeds.

Although the detailed description describes embodiments using a flash EPROM, the invention may be used with any nonvolatile writeable memory, including, but not limited to, EPROMs, EEPROMs, and flash memories, including technologies such as NOR, NAND, AND, Divided bit-line NOR (DINOR), and Ferro-electric Random Access Memory (FRAM). While the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A method of saving overhead programming time in a memory device, comprising the steps of:

directing a wordline programming voltage and a bitline enabling voltage to a comparator circuit;

directing an output signal from said comparator circuit to a state machine once said wordline programming voltage and said bitline enabling voltage reach a predetermined voltage level; and programming at least one cell in said memory device once said wordline programming voltage and said bitline enabling voltage reach said predetermined voltage level.

2. The method of claim 1, wherein said wordline programming voltage is generated with a wordline voltage generation circuit.

3. The method of claim 2, wherein said wordline voltage generation circuit is a charge pump.

4. The method of claim 1, wherein said bitline enabling voltage is generated with a bitline voltage generation circuit.

5. The method of claim 4, wherein said bitline voltage generation circuit is a charge pump.

6. The method of claim 1, wherein said predetermined voltage is approximately 8.5 V.

7. The method of claim 1, further comprising the step of directing said wordline programming voltage to a wordline decoder circuit.

8. The method of claim 7, wherein said wordline decoder circuit transfers said wordline programming voltage to said cell.

9. The method of claim 1, further comprising the step of directing said bitline enabling voltage to a bitline decoder circuit.

10. The method of claim 9, wherein said bitline decoder circuit is used to gate a predetermined bitline programming voltage to said cell.

11. The method of claim 10, wherein said predetermined bitline programming voltage is approximately 5 V.

12. A method of reducing programming time in a memory device, comprising the steps of:

generating a wordline programming voltage with a wordline voltage generation circuit;

generating a bitline enabling voltage with a bitline voltage generation circuit;

directing said wordline programming voltage and said bitline enabling voltage to a comparator circuit; and programming at least one cell in said memory device when said comparator circuit senses that said wordline programming voltage and said bitline enabling voltage reach a predetermined voltage level.

13. The method of claim 12, further comprising the step of directing said wordline programming voltage to a wordline decoder circuit.

14. The method of claim 13, wherein said wordline decoder circuit transfers said wordline programming voltage to said cell during programming.

15. The method of claim 12, further comprising the step of directing said bitline enabling voltage to a bitline decoder circuit.

16. The method of claim 15, wherein said bitline decoder circuit gates a bitline programming voltage to said cell during programming.

17. The method of claim 16, wherein said bitline programming voltage is approximately 5 V.

18. The method of claim 12, wherein said wordline voltage generation circuit is a charge pump.

19. The method of claim 12, wherein said bitline voltage generation circuit is a charge pump.

20. The method of claim 12, wherein said predetermined voltage level is approximately 8.5 V.

21. A memory device with reduced overhead programming time for at least one cell in a memory sector, comprising:

a state machine for controlling said memory device;

a wordline voltage generation circuit and a bitline voltage generation circuit electrically connected with said state machine, wherein said wordline voltage generation circuit generates a wordline programming voltage and said bitline voltage generation circuit generates a bitline enabling voltage;

a comparator circuit electrically connected with said state machine, said wordline voltage generation circuit and said bitline voltage generation circuit, wherein said comparator circuit compares said wordline programming voltage with said bitline enabling voltage and generates a comparator output signal that is directed to said state machine once a predetermined voltage level is reached;

a wordline decoder circuit electrically connected with said state machine, said wordline voltage generation circuit and said memory sector for directing said wordline programming voltage to said cell in said memory sector during programming; and a bitline decoder circuit electrically connected with said state machine, said bitline voltage generation circuit and said memory sector for gating a bitline programming voltage to said cell in said memory sector during programming.

22. The memory device of claim 21, wherein said wordline voltage generation circuit is a charge pump.

23. The memory device of claim 21, wherein said bitline voltage generation circuit is a charge pump.

24. The memory device of claim 21, wherein said predetermined voltage level is approximately 8.5 V.

25. The memory device of claim 21, wherein said bitline programming voltage level is approximately 5 V.

* * * * *